Dec. 10, 1957 H. JOHNSON 2,816,228

SEMICONDUCTOR PHASE SHIFT OSCILLATOR AND DEVICE

Filed May 21, 1953

INVENTOR.
Harwick Johnson

BY J. L. Whittaker
ATTORNEY

United States Patent Office 2,816,228 Patented Dec. 10, 1957

2,816,228

SEMICONDUCTOR PHASE SHIFT OSCILLATOR AND DEVICE

Harwick Johnson, Princeton, N. J., assignor to Radio Corporation of America, a corporation of Delaware Application May 21, 1953, Serial No. 356,407

10 Claims. (Cl. 250—36)

This invention pertains to semiconductor devices and particularly to semiconductor phase-shift oscillators and devices.

One basic form of semiconductor device is known as a P-N junction transistor and comprises a body of semiconductor material of one type of conductivity having two zones of opposite conductivity material formed therein and separated therefrom by rectifying barriers. A base electrode is in ohmic contact with the semiconductor body and the two zones are operated as emitter and collector electrodes. In operation of a transistor, the emitter electrode injects minority charge carriers, either holes or electrons, into the semiconductor body where they are collected by the collector electrode. The flow of current between the emitter and collector electrodes is influenced by the electrical condition of the semiconductor body which is determined by the electrical potential applied to the base electrode.

In the electron tube art, it is well known that a tube may be operated, in a suitable circuit, as a phase-shift oscillator. In such circuits, a resistance-capacity phase shifting network is connected between the output and the input of an amplifier tube, the circuit being proportioned to provide a 180° phase shift at the desired oscillation frequency. In accordance with the invention, a transistor may be similarly operated in such an external phase-shifting circuit. Also in accordance with a preferred embodiment of the invention, a semiconductor phase-shift oscillator is incorporated in a unitary body whereby much of the circuitry of the conventional phase-shift oscillator is eliminated.

Accordingly, an important object of this invention is to provide a semiconductor device of new and improved form.

Another object is to provide a new and improved semiconductor device capable of functioning as a phase-shift oscillator.

A further object is to provide a novel phase-shift oscillator in a unitary semiconductor body.

In general, the purposes and objects of this invention are accomplished by providing a semiconductor body having a portion thereof formed as a transistor and another portion formed as a controllable phase shift (for example, resistance-capacitance) network or delay line, the two portions being related and interconnected to provide the desired function.

The invention is described in greater detail with reference to the drawing wherein.

Similar elements are designated by similar reference characters throughout the drawing.

Figure 1:
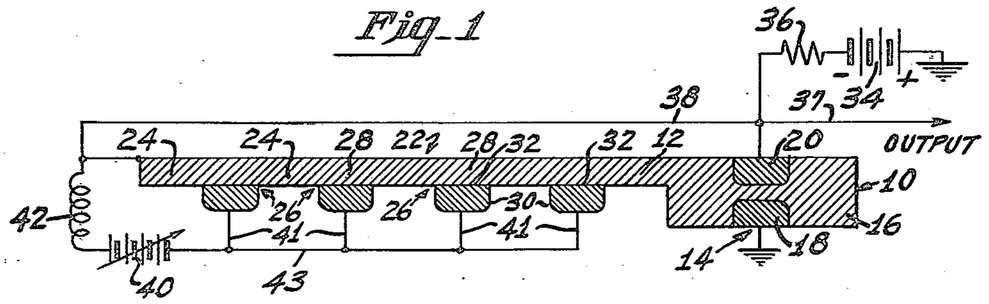
Fig. 1 is a sectional, elevational view of one embodiment of the invention.

Referring to Figure 1, a semiconductor device 10 according to the invention comprises a body 12 of semiconductor material of germanium, silicon or the like of N-type or P-type conductivity. The body includes a first portion 14 which comprises either an N-P-N or P-N-P transistor. For example, the body 12 may be N-type germanium and the portion 14 may comprise a P-N-P transistor having an N-type body 16 and having one P-type region 18 intended to be operated as an emitter electrode and another P-type region 20 intended for operation as a collector electrode. Contiguous or integral with the N-type body portion 16, according to the invention, is a portion 22 of semiconductor material which is formed and operated as a resistance-capacitance phase shift network or delay line. The phase shift network 22 includes, as resistor elements, a plurality of filamentary portions 24 of the same type of conductivity as the transistor body 16, i. e. N-type. The phase shift network also includes, as capacitor elements, regions 26 which alternate with the filamentary portions 24 and which comprise P-N junctions. Each of the P-N junctions 26 includes a portion 28 of the N-type body 12 and a zone 30 of P-type material separated from each other by a rectifying barrier 32. The last portion of the phase shift network may be either a filamentary region 24 or a P-N junction region 26, preferably the former.

In the preparation of the device 10, the basic element is the semiconductor body 12 which may be in the form of an elongated crystal of N-type germanium. The semiconductor crystal is provided with the P-N junction regions 26 and the P-N junction emitter and collector electrodes 18 and 20 by any suitable method. One such method is described by C. W. Mueller in his copending U. S. patent application, Serial No. 294,741, filed June 20, 1952, and assigned to the assignee of this application. Briefly, according to Mueller's method, disks or pellets of a suitable impurity material are alloyed into opposite surfaces of the N-type crystal 12 to form thin layers of P-type material which are separated from the N-type body by rectifying barriers. Generally, according to this alloying method, adjacent to the P-type layers are regions of material which are an alloy of the impurity material and the material of the crystal and do not have semiconducting properties. If the semiconductor crystal is of N-type material, the impurity substance may be any one of indium, aluminum, gallium, boron or zinc or an alloy of any of theses. If the crystal 12 is of P-type material, the impurity disk may be any one or a combination of phosphorus, arsenic, antimony, bismuth, sulfur, selenium or tellurium. After the P-N junction portions have been formed and the necessary crystal surface treatment has been provided, the crystal may be provided with the filamentary resistance elements 24 by means of an etching operation or by means of an abrading operation such as sandblasting. If desired, the filamentary portions may be formed before the P-N junctions are prepared in the crystal.

In operation of the device 10, the emitter region or electrode 18 is connected to ground and the collector electrode 20 is biased in the reverse direction in conventional fashion by a connection to the negative terminal of a battery 34, the positive terminal of which is connected to ground. A load device, for example a load impedance 36 is connected in series with the collector electrode and the battery 34. The end of the load impedance connected to the collector electrode has a lead 37 which is connected to a suitable output utilization device. The same end of the load impedance is also connected by a feedback lead 38 to the last element of the phase shift network or delay line 22. According to the invention, a variable bias source, such as a battery 40, provides a variable bias voltage across the P-N junction electrodes 26 comprising the capacitance portion of the phase shift network 22. The battery 40 has one terminal connected through leads 41 and a lead 43 to the regions 30 and the other terminal connected through a high frequency choke coil 42 to the last resistive element 24. The lead 43 is grounded. Thus the battery 40 is connected across the P-N junctions 26. The P-N junction portions 26 may be operated in either the forward or reverse direction and, accordingly, the battery 40 is connected appropriately between the P-type regions 30 and the last region 24. With forward operation of the P-N junctions, the positive terminal of the battery is connected to the region 30. With reverse operation, the negative terminal of the battery is connected to the region 30.

As set forth above, the filamentary portions 24 comprise the resistance elements and the P-N junction portions 26 comprise the capacitance elements of the phase shift network 22. The resistance value of the filaments 24 is substantially constant. However, the capacitance of the P-N junctions may be varied. If, for example, the P-N junctions are biased in the reverse direction, the space charge associated with each junction extends into the N-type region thereby changing the capacitance of the junction and thereby changing the phase shift of the entire network and the operating frequency of the device. Thus by varying the bias applied to the P-N junction portions 26, the characteristics of the phase shift network may be varied and the operating frequency of the device may be selected. The same end results may be achieved if the P-N junctions are biased in the forward direction.

Figure 2:
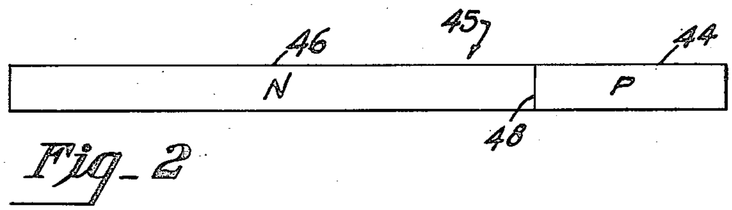
Fig. 2 is an elevational view of a semiconductor crystal utilized in preparing a second embodiment of the invention.

If desired, the load impedance 36 may be prepared as an integral part of the body 12 of the device 10. This modification of the invention, referring to Figures 2 and 3, may be prepared by growing a crystal of semiconductor material 45, preferably germanium, having a P-type region 44 and an N-type region 46 separated therefrom by a rectifying barrier 48. The P-type region may be etched or abraded to provide a filamentary portion 50 (Figure 3) having the desired load resistance. The remainder of the crystal, i. e. the N-type portion 46, may be treated to provide the filamentary portions 24 of the phase-shift network and then the P-N junction portions 26 may be formed by an alloying operation as hereinbefore described.

Figure 3:
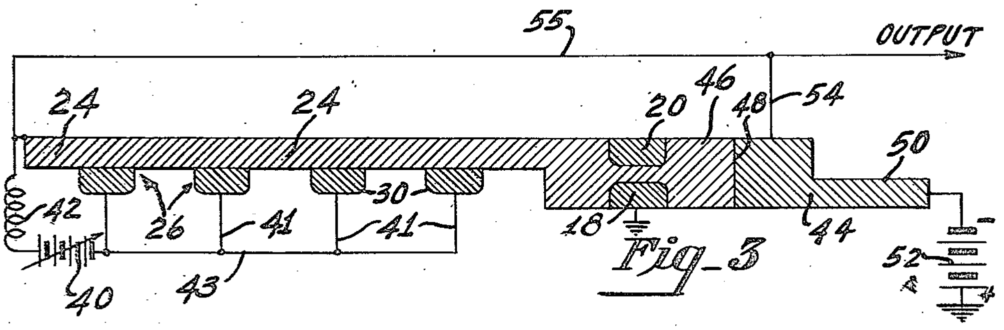
Fig. 3 is a sectional, elevational view of said second embodiment of the invention; and, Fig. 4 is a sectional, elevational view of a third embodiment of the invention.

In operation of the modification of the invention shown in Figure 3, the free end of the load resistance portion 50 of the P-type region 44, which is also the collector electrode of the transistor portion of the device, is connected to the negative terminal of a battery 52, to provide the proper collector bias. The positive terminal of the battery is connected to ground. The P-type region is thus biased in the reverse direction with respect to the N-type portion 46 whereby it may function as a collector electrode in conventional fashion. A lead 54 is also connected to the P-type region 44 adjacent to the rectifying barrier 48, this lead being intended to serve as the conductor for charges injected by the emitter electrode 18 and collected by the collector electrode 44. The lead 54 is connected to a suitable output circuit (not shown) and by a feedback lead 55 to the body of the device at the end of the phase shift network or delay line 22 as described with respect to Figure 1.

Figure 4:
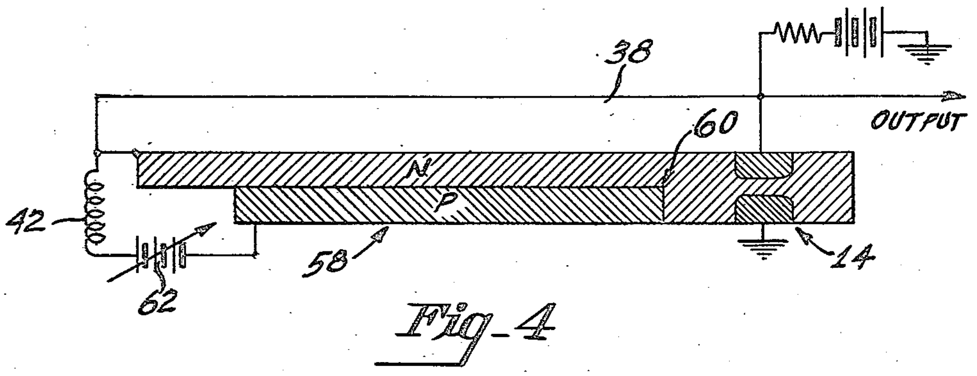

In a third modification of the invention shown in Figure 4, the device includes the transistor portion 14 and a phase shift network or delay line 58. The network 58 comprises a single extended P-N junction 60 which, in itself, provides the resistance and capacitance characteristics desired for operation of the device as a phase-shift oscillator. In this modification as in those previously described herein, the P-N junction 60 is provided with a variable bias source 62 to change the capacitance of the junction and thereby vary the operating characteristics of the device.

The capacitance of a P-N junction biased in the reverse direction may be determined from the formula:

$$C=\frac{KA}{4\pi W}$$

wherein:

$K$=dielectric constant of the semiconductor material
$W$=thickness of the P-N junction
$A$=cross-section area of the P-N junction The capacitance of a P-N junction biased in the forward direction may be determined from the formula:

$$C=\frac{qL^2I}{kT4D}$$

wherein $q$=magnitude of electron charge
$L$=diffusion length of minority carriers
$k$=Boltzmann's constant
$T$=temperature in degrees Kelvin
$D$=diffusion constant
$I$=current The resistance of a piece of semiconductor material may be determined from the formula:

$$R=\frac{rL}{A}$$

wherein:

$r$=resistivity of the semiconductor material
$L$=length of the piece
$A$=cross-section area of the piece

What is claimed is:

1. A semiconductor device comprising a body of semiconductor material having alternating zones of different conductivity material and a semiconductor delay line integral with one of said zones, said delay line including a plurality of series connected filaments of semiconductor material and P–N junction portions.

2. A semiconductor device comprising a body of semiconductor material having alternating zones of different conductivity material and a semiconductor delay line contiguous with one of said zones and connected to another one of said other zones and thereby providing feedback between said one zone and said other one of said zones, said delay line including a plurality of series-connected alternating filaments of semiconductor material of one type of conductivity and P–N junction portions.

3. A semiconductor device comprising a body of semiconductor material having alternating zones of different conductivity material and a semiconductor delay line connected to one of said zones, said delay line including a plurality of series connected alternating filaments of semiconductor material of one type of conductivity and P–N junction portions and bias voltage means connected to said P–N junction portions for varying the capacitance thereof.

4. A semiconductor phase shift network comprising a unitary semiconductor body including a plurality of series-connected alternating elements of semiconductor material of one type of conductivity and P–N junction elements, and bias voltage means connected to said P–N junction elements for varying the capacitance thereof.

5. A semiconductor device comprising a body of semiconductor material, a first and a second rectifying electrode in contact with said body, and a resistance-capacitance delay line connected to said body, said delay line including a body of semiconductor material which is an extension of said first mentioned body and a rectifying electrode in contact therewith.

6. A semiconductor phase-shift oscillator device comprising a body of semiconductor material having alternating zones of different conductivity material and a semiconductor phase-shift network electrically connected to one of said zones.

7. A semiconductor phase-shift oscillator device comprising a body of semiconductor material having alternating zones of different conductivity material and a semiconductor phase-shift network electrically connected to one of said zones, said phase-shift network including a plurality of series-connected alternating filaments of semiconductor material of one type of conductivity and P-N junction portions.

8. A semiconductor phase-shift oscillator device comprising a body of semiconductor material, a first and a second rectifying electrode in contact with said body, and a resistance-capacitance phase-shift network electrically connected to said body, said phase-shift network including a body of semiconductor material and a series of spaced rectifying electrodes in contact therewith.

9. A semiconductor phase-shift oscillator device comprising a body of semiconductor material, a first and a second rectifying electrode in contact with said body, a resistance-capacitance phase-shift network electrically connected to said body, said phase-shift network including a body of semiconductor material and a third rectifying electrode in contact therewith, and bias voltage means directly connected to said third rectifying electrode for varying the capacitance thereof.

10. A semiconductor phase-shift oscillator device comprising, in combination, an amplifier element and a semiconductor phase-shift network electrically connected thereto, said network including a plurality of series connected alternating filaments of semiconductor material of one type of conductivity and P-N junction portions.

References Cited in the file of this patent

UNITED STATES PATENTS 2,600,500 Haynes et al. ------------ June 17, 1952